United States Patent [19]

Pagel

[11] 4,193,041
[45] Mar. 11, 1980

[54] CONDITION RESPONSIVE INDUCTANCE TO FREQUENCY CONVERTER WITH TEMPERATURE COMPENSATION

[75] Inventor: Ernst-Olav Pagel, Böhmfeld, Fed. Rep. of Germany

[73] Assignee: Robert Bosch GmbH, Stuttgart, Fed. Rep. of Germany

[21] Appl. No.: 905,611

[22] Filed: May 12, 1978

[30] Foreign Application Priority Data

Jun. 15, 1977 [DE] Fed. Rep. of Germany ....... 2726894

[51] Int. Cl.² .......................... G01L 9/10; H03K 3/02
[52] U.S. Cl. ...................................... 331/65; 73/708; 73/753; 331/108 D; 331/143; 331/176; 331/181
[58] Field of Search ................... 331/65, 108 D, 111, 331/143, 176, 181; 73/708, 753, 754; 123/119 EC, 119 ED

[56] References Cited

U.S. PATENT DOCUMENTS

| 3,745,384 | 7/1973 | Blanchard | 331/65 X |
| 3,806,828 | 4/1974 | Johnson | 331/108 D X |

*Primary Examiner*—Siegfried H. Grimm
*Attorney, Agent, or Firm*—Edwin E. Greigg

[57] ABSTRACT

A circuit arrangement for converting an inductance value into a specific frequency particularly for producing a pressure-dependent frequency fully compensated against variations in temperature for injection systems in internal combustion engines. The circuit arrangement comprises a comparator, the output of which is connected to a series circuit comprising at least one diode, a coil with variable inductance and a temperature-dependent resistor, all connected to a current supply line with the end of the coil opposite the comparator output coupled back to a first input of the comparator. The potential of the second input of the comparator can be affected by the output value of a voltage divider between the two current supply lines and a regenerative feedback line emanating from the output of the comparator. During the operation of the circuit arrangement, a pulse sequence is obtained, the frequency of which is determined by the inductance.

8 Claims, 1 Drawing Figure

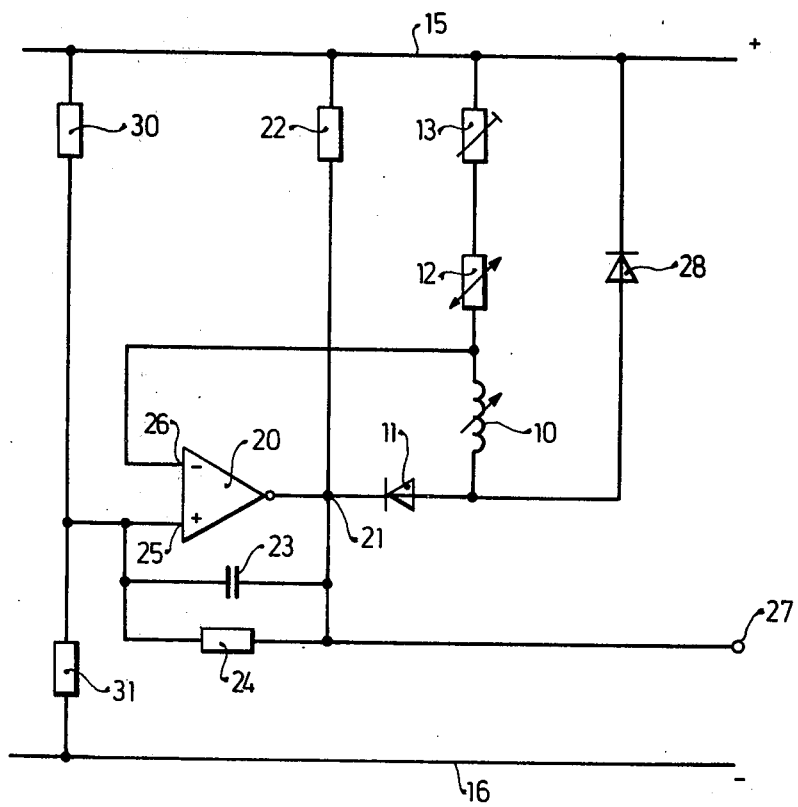

CONDITION RESPONSIVE INDUCTANCE TO FREQUENCY CONVERTER WITH TEMPERATURE COMPENSATION

BACKGROUND OF THE INVENTION

The invention relates to a circuit arrangement for converting an inductance value into a certain frequency for producing a pressure-dependent frequency for fuel injection systems in internal combustion engines. In the conventional circuit arrangement, the output of a comparator, being in series with a current supply line, contains neither a diode nor a temperature-dependent resistor and as a result the circuit arrangement is affected by variations in the ambient temperature. Additionally during switching processes, the signal at the output of the comparator can range above the operating voltage due to self-inductance voltage peaks, and this elevated signal level can be disadvantageous for a circuit arrangement connected thereafter.

OBJECT AND SUMMARY OF THE INVENTION

Accordingly, it is a principal object of this invention to provide a circuit arrangement of the type described above which is fully compensated against variations in temperatures.

Another object of this invention is to provide a circuit arrangement which is an improvement over the prior art circuits described above, in that the signal at the output of the comparator stage will always be below the level of the operating voltage and thus eliminate any danger of damage to subsequently connected circuit arrangements.

The objects are attained, according to the invention, primarily by providing a series circuit connected to the output of the comparator and comprising a diode, a coil, and a pair of resistors, one of which is variable and connected in series with a temperature-dependent resistor, to maintain the temperature coefficient of the entire circuit at a zero value. This circuit is especially important in automotive vehicle operation where the temperatures can fluctuate greatly during the seasons of the year and where the temperature can be very high during the operation of the internal combustion engine.

The invention will be better understood, as well as further objects and advantages thereof become more apparent, from the following description taken in conjunction with the drawing.

BRIEF DESCRIPTION OF THE DRAWINGS

The sole FIGURE in the accompanying drawing illustrates the preferred embodiment of the invention.

DESCRIPTION OF THE PREFERRED EMBODIMENT

In the drawing, numeral 10 denotes a coil with a variable inductance, and connected to a pressure source from an internal combustion engine (not shown), and connected in series to a diode 11 as well as a temperature-dependent resistor 12 and a variable resistor 13. This series circuit is connected between a positive line 15 and the output of a comparator 20 in the following sequence: variable resistor 13, temperature-dependent resistor 12, coil 10, and diode 11. The output of the comparator 20 is connected to a node 21 and to the positive line 15 through a resistor 22 and, furthermore, a parallel RC circuit, comprising a capacitor 23 and a resistor 24, is coupled between node 21 and the positive input 25 of the comparator 20. Moreover, the node 21 is directly connected to the signal output 27 of the circuit arrangement. A negative input 26 of the comparator 20 is coupled between the temperature-dependent resistor 12 and the coil 10. A freewheeling diode 28 has its cathode connected to the positive line 15 and its anode connected between coil 10 and diode 11. Finally, to form a voltage divider, one resistor 30 is connected between the positive input 25 of the comparator 20 and the positive line 15 and a second resistor 31 is connected between the positive input 25 and the negative line 16 so that the positive input 25 is responsive to variations in line voltages.

The essential aspect of the invention in the above-described circuit arrangement is the series connection of diode 11 and coil 10 between the output of the comparator 20 and its negative input 26 and the temperature-dependent resistor 12 between the coil 10 and the positive line 15. The switching procedure executed by the comparator is dependent on the voltage drop across coil 10 and takes place as follows:

Since the current cannot surge through coil 10 at the instant the circuit arrangement is activated, a large voltage drop occurs across coil 10. The potential at the negative input 26 of comparator 20 is, therefore, positive, and the potential at the node 21 and thus at the signal output 27 of the circuit arrangement is negative or close to zero. The diode 11 is conductive under these potential conditions, and thus an increased flow of current commences through coil 10, reducing the positive potential at the negative input 26 of comparator 20. The switching condition of the comparator 20 flips over once the potential at the negative input 26 falls below the potential at the positive input 25, and, as a consequence, the voltage at node 21 rises, and diode 11 becomes non-conductive. Since the current flow through coil 10 cannot change instantaneously, the coil current flows in the circuit comprising coil 10, free-wheeling diode 28, variable resistor 13, as well as temperature-dependent resistor 12. Inasmuch as the potential on the positive line 15 is held constant, the potential at the connecting point between coil 10 and diode 11 is higher by about 0.7 volt than that of the positive line 15. The diode 11 reduces this potential by about the same amount, so that the maximum voltage that can occur is the voltage between the positive line 15 and the negative line 16 at the node 21 and at the signal output 27. If the current flow through coil 10 decreases due to leakage in resistors 12 and 13, the voltage at the negative input 26 of comparator 20 increases with respect to the negative line 16, and the switching condition of the comparator 20 flips back again into its original position, and thus the process begins anew.

To keep the output frequency of the comparator 20 within a limited range, the regenerative feedback is included for the comparator 20, in the form of an RC network comprising the aforementioned capacitor 23 and resistor 24.

The temperature-dependent resistor preferably has a positive temperature coefficient to compensate for the negative temperature coefficients of diode 11 and inductance 10. By means of the variable resistor 13, the voltage relationships in the series circuit of resistors 12 and 13, coil 10, and diode 11 can be set so that, in total, a zero temperature coefficient is obtained. This has the advantage that the output frequency of the circuit arrangement becomes independent of the temperature and thus the frequency solely depends on the value of the inductance of coil 10.

The foregoing relates to a preferred embodiment of the invention, it being understood that other embodiments and variants thereof are possible within the spirit and scope of the invention, the latter being defined by the appended claims.

What is claimed and desired to be secured by Letters Patent of the United States is:

1. A circuit arrangement for converting an inductance value into a specific frequency especially for producing a pressure-dependent frequency for injection systems in internal combustion engines, comprising:
   a comparator, a series circuit including at least one coil with a variable inductance, a diode, and a temperature-dependent resistor coupled between the output of said comparator and a positive current supply line, the end of the coil on the side opposite the comparator output being connected to a first input to the comparator and the second input to the comparator being connected to a source of positive potential, and
   a freewheeling diode connected between the output of the comparator and the positive current supply line and bridging the coil.

2. The circuit arrangement as claimed in claim 1, wherein the temperature-dependent resistor has a positive temperature coefficient.

3. The circuit arrangement as claimed in claim 1, wherein a variable resistor is connected in series with the temperature-dependent resistor.

4. The circuit arrangement as claimed in claim 3, wherein the variable resistor is set to a value at which the temperature coefficient of at least the series circuit of the temperature-dependent resistor, coil and diode equals zero.

5. The circuit arrangement as claimed in claim 4, wherein a regenerative feedback RC network is provided for the comparator, said network being connected between the second input to the comparator and the comparator output.

6. The circuit arrangement as claimed in claim 5, wherein the second input to the comparator is connected to a voltage divider coupled between positive and negative current supply lines.

7. A circuit arrangement for converting an inductance value into a specific frequency in which said inductance value is changed by a change in pressure in a pressure source, including a comparator for generating said frequency on an output line, said comparator having a negative input, a positive input, and an output connected to said output line, and a positive and a negative current source, said circuit arrangement comprising:
   a coil whose inductance varies in response to variations in pressure from said pressure source,
   one end of said coil being connected to the output of said comparator,
   a first resistor and a second resistor connected in series between the second end of said coil and said positive current source, one of said resistors being variable for adjusting said arrangement to compensate for any temperature variations,
   circuit means connecting the second end of said coil to the negative input to said comparator,
   a freewheeling diode connected between said output of said comparator and said positive current source,
   a regenerative feedback network connected between said output of said comparator and the positive input to said comparator, and,
   a voltage divider network between said positive and negative current source connected to the positive input to said comparator.

8. The circuit arrangement as claimed in claim 7, wherein a second diode is connected between the first end of said coil and the output of said comparator.

* * * * *